(12) United States Patent
Kazama

(10) Patent No.: US 9,112,113 B2
(45) Date of Patent: Aug. 18, 2015

(54) SEMICONDUCTOR ELEMENT AND MANUFACTURING METHOD THEREOF

(71) Applicant: STANLEY ELECTRIC CO., LTD., Meguro-ku, Tokyo (JP)

(72) Inventor: Takuya Kazama, Adachi-ku (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 68 days.

(21) Appl. No.: 13/772,027

(22) Filed: Feb. 20, 2013

(65) Prior Publication Data

US 2013/0214292 A1 Aug. 22, 2013

(30) Foreign Application Priority Data

Feb. 21, 2012 (JP) ................................. 2012-034900

(51) Int. Cl.
| | |
|---|---|
| *H01L 33/38* | (2010.01) |
| *H01L 33/40* | (2010.01) |
| *H01L 33/02* | (2010.01) |
| *H01L 21/02* | (2006.01) |
| *H01L 33/46* | (2010.01) |
| *H01L 33/22* | (2010.01) |
| *H01L 33/00* | (2010.01) |

(52) U.S. Cl.
CPC .......... *H01L 33/38* (2013.01); *H01L 21/02694* (2013.01); *H01L 21/02697* (2013.01); *H01L 33/0079* (2013.01); *H01L 33/02* (2013.01); *H01L 33/22* (2013.01); *H01L 33/405* (2013.01); *H01L 33/46* (2013.01); *H01L 2933/0091* (2013.01)

(58) Field of Classification Search
None
See application file for complete search history.

(56) References Cited

U.S. PATENT DOCUMENTS

| 2005/0098609 A1* | 5/2005 | Greenhut et al. .......... 228/122.1 |
| 2007/0096116 A1* | 5/2007 | Yasuda et al. .................... 257/79 |
| 2008/0290349 A1* | 11/2008 | Takahashi ....................... 257/79 |

FOREIGN PATENT DOCUMENTS

JP 2009-010359 A 1/2009

\* cited by examiner

*Primary Examiner* — Johannes P Mondt
(74) *Attorney, Agent, or Firm* — Holtz, Holtz, Goodman & Chick PC

(57) ABSTRACT

A manufacturing method of a semiconductor element which can improve productivity and reliability, comprises a step of forming a device structure layer including a semiconductor layer on a first substrate; a step of forming a first metal layer on the device structure layer; a step of forming a second metal layer made of the same material as the first metal layer on a second substrate; a first treatment step of heating and compressing together the first metal layer and the second metal layer placed opposite to each other, thereby bonding them with maintaining a junction interface between the first and second metal layers; and a second treatment step of heating the first and second metal layers to make the junction interface disappear. Either one of the first and second metal layers has a coarse surface having multiple pyramid-shaped protrusions formed at its surface.

7 Claims, 8 Drawing Sheets

BONDING LAYER THICKNESS d=200nm

BONDING LAYER THICKNESS d=400nm

SEMICONDUCTOR ELEMENT AND MANUFACTURING METHOD THEREOF

BACKGROUND OF THE INVENTION

1. Field of the Invention

The present invention relates to a semiconductor element, particularly to a light emitting diode (LED) and a manufacturing method thereof.

2. Description of the Related Art

Light emitting devices equipped with LED elements have been used in lighting, backlight, industrial apparatuses, and the like since some years before. In these light emitting devices, the brightness of light emitting elements is becoming higher and higher. LED elements are produced by epitaxial-growing a semiconductor layer of AlGaInP, GaN, or the like on a growth substrate such as a GaAs substrate or a sapphire substrate using an MOCVD (Metal-Organic Chemical Vapor Deposition) method or so on. With LED elements produced in this way, there exists a problem that light emitted from the light emitting layer is absorbed or so on in the growth substrate, resulting in a reduction in the efficiency of light extraction from the elements.

In order to solve the above problem, after the semiconductor layer grown on a growth substrate is stuck to a conductive support substrate via a light reflective material, the growth substrate is removed, thereby producing LED elements (Patent Literature 1).

PTL 1: Japanese Patent Application Laid-Open Publication No. 2009-10359

SUMMARY OF THE INVENTION

In the aforementioned production of a semiconductor element using a support substrate, the semiconductor layer and the conductive support substrate have been bonded together using a eutectic such as AuSn or InAu (eutectic bonding). Where the eutectic bonding is used, barrier metal layers are formed on both the semiconductor layer and the conductive support substrate in order to prevent the diffusion of Sn or In contained in eutectic material, which corrodes metal in ohmic contact with the conductive support substrate or the light reflective material.

However, the introduction of barrier metal layers makes the layer structure of the semiconductor elements complex, resulting in a decrease in production yield of the semiconductor elements and an increase in production cost. Further, even if barrier metal layers are introduced, it is difficult to prevent the diffusion of eutectic material completely, and a problem occurs in the reliability of the semiconductor elements. Yet further, for the eutectic bonding, eutectic material must be melted or softened at a high temperature of about 280° C. to 350° C., and in addition if temperature unevenness exists in the wafer surface, then unevenness occurs in melting or softening, resulting in the occurrence of large empty spaces (voids) of several μm or greater in the junction. Moreover, because the wafer has to be processed at high temperature, a warp, separation, or destruction occurs in the wafer due to the difference in thermal expansion coefficient between the semiconductor layer and the conductive support substrate. Thus, the eutectic bonding is difficult to use for the bonding of a large-diameter wafer.

For the bonding of the semiconductor layer and the conductive support substrate, fusion bonding can also be used wherein with the flatness of the bonding surfaces of metal such as Au or Ag being made 0.5 nm or less and with the bonding surfaces being kept normal in an ultrahigh vacuum, they are bonded together at room temperature. Also, metal diffusion bonding can be used wherein with the flatness of the bonding surfaces being made 2.0 nm or less, they are thermally compression bonded at relatively low temperature using metal diffusion.

These two methods do not need processing at high temperature when bonding, but need the process of flattening the bonding surfaces. As to the fusion bonding, it will be very costly because bonding must be performed in a high vacuum and thus is not appropriate to be used for the bonding of the semiconductor layer and the conductive support substrate in the production of semiconductor elements.

The present invention has been made in view of the above facts, and an object thereof is to provide a semiconductor element and a manufacturing method thereof wherein a barrier metal layer is not needed in the bonding of a semiconductor layer and the conductive support substrate in the production of the semiconductor element such as an LED element using a conductive support substrate, notably wherein a large-diameter semiconductor wafer and the support substrate can be stuck uniformly together at low temperature with fewer voids, preventing a warp or destruction of the semiconductor wafer and the support substrate due to the bonding process, resulting in being excellent in productivity, yield, and reliability.

A manufacturing method of a semiconductor element according to the present invention comprises a step of forming a device structure layer including a semiconductor layer on a first substrate; a step of forming a first metal layer on the device structure layer; a step of forming a second metal layer made of the same material as the first metal layer on a second substrate; a first treatment step of heating and compressing together the first metal layer and the second metal layer placed opposite to each other, thereby bonding them with maintaining a junction interface between the first metal layer and the second metal layer; and a second treatment step of heating the first metal layer and the second metal layer to make the junction interface disappear. Either one of the first metal layer and the second metal layer has a coarse surface having multiple pyramid-shaped protrusions formed at its surface.

A semiconductor element according to the present invention comprises a substrate; a junction layer formed over the substrate by heating and compression bonding together two metal layers each having crystal grains, the junction layer being formed of crystal grains made by recrystallization of the crystal grains of the two metal layers; a bonding aid layer provided between the junction layer and the substrate and forming an interface having pyramid-shaped protrusions with the junction layer; and a device structure layer formed on the junction layer.

With the semiconductor element and its manufacturing method of the present invention, the bonding of a semiconductor wafer and a support substrate by sticking uniformly them together at low temperature with fewer voids is possible, with preventing the occurrence of a warp or destruction of the semiconductor wafer and the support substrate after the bonding. Thus, the productivity and reliability of the semiconductor element such as an LED element can be improved.

DETAILED DESCRIPTION

Embodiment 1

Figure 1A:
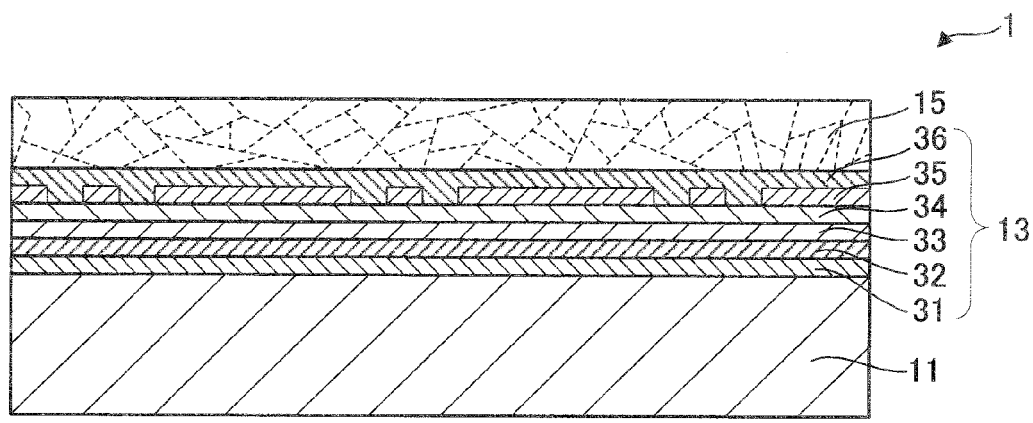
FIG. 1A is a cross-sectional view of a semiconductor wafer to be bonded by the manufacturing method according to Embodiment 1 of the present invention.
Figure 1B:
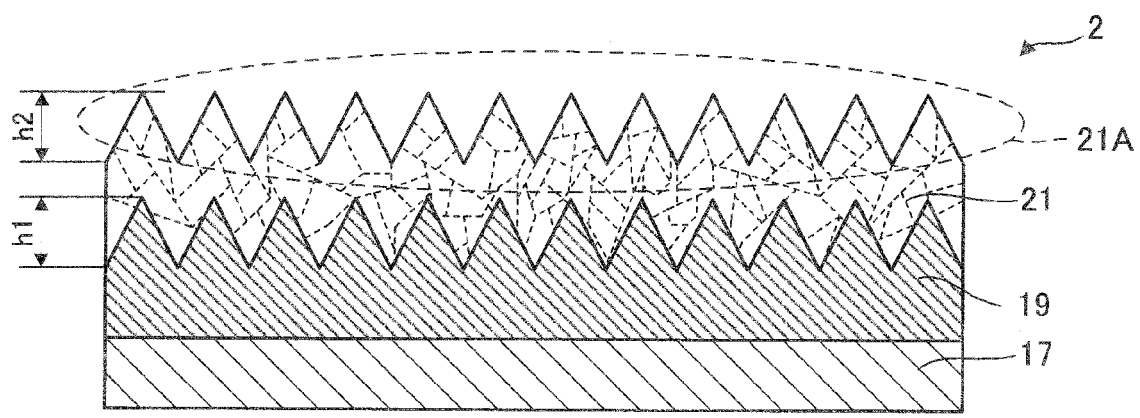
FIG. 1B is a cross-sectional view of a support structure to be bonded by the manufacturing method according to Embodiment 1 of the present invention.
Figure 2:
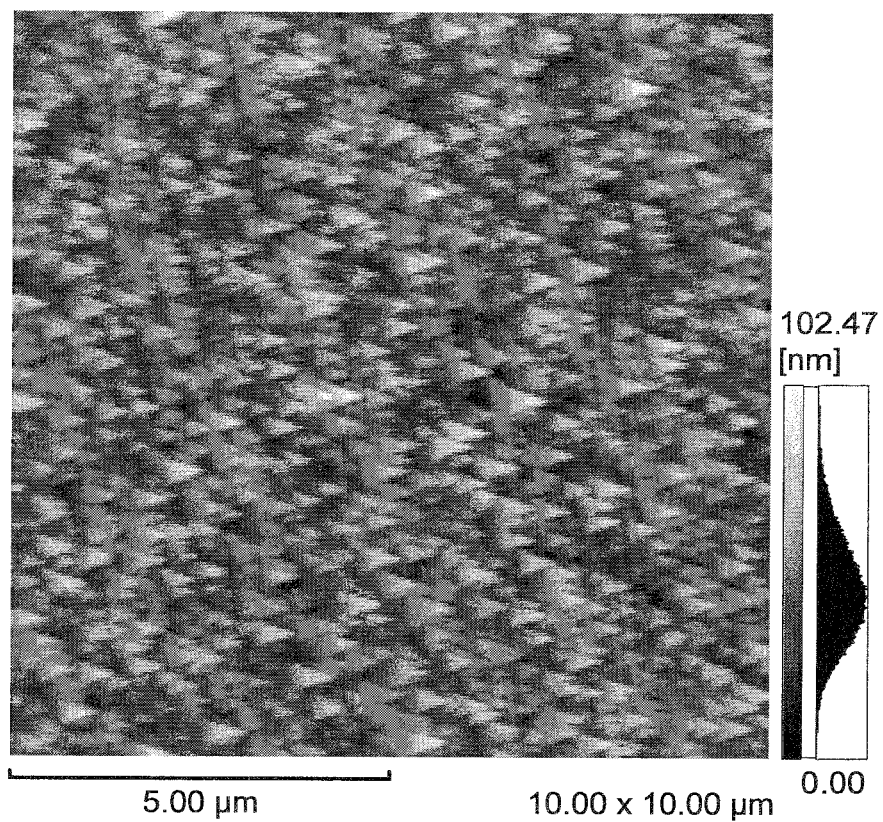
FIG. 2 is a SEM image of pyramid-shaped protrusions formed in the manufacturing method according to Embodiment 1 of the present invention.
Figure 3:
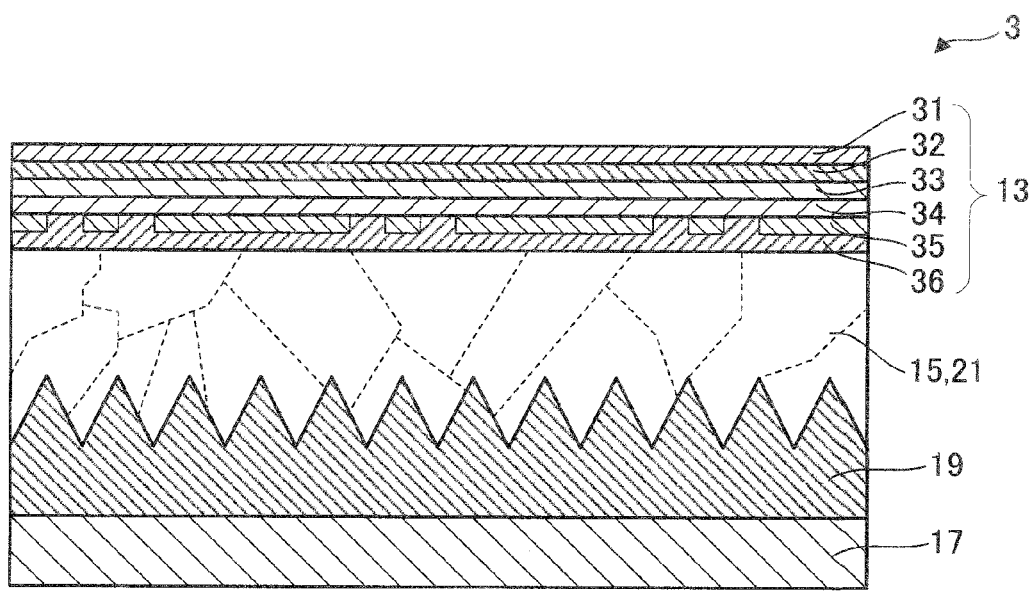
FIG. 3 is a cross-sectional view of an LED element produced using the manufacturing method according to Embodiment 1 of the present invention.

A manufacturing method of a light emitting element according to Embodiment 1 of the present invention will be described below with reference to FIGS. 1A, 1B, 2, and 3. FIGS. 1A and 1B are respectively cross-sectional views of a semiconductor wafer and a support structure to be bonded together by the manufacturing method of the light emitting element according to Embodiment 1 of the present invention. FIG. 2 is a SEM (Scanning Electron Microscopy) image of pyramid-shaped protrusions formed in a bonding surface. FIG. 3 is a cross-sectional view of the light emitting element completed by bonding.

For Embodiment 1, description will be made taking an AlGaInP-based LED as an example. The semiconductor wafer 1 comprises a growth substrate 11, a device layer (device structure layer) 13 grown over the growth substrate 11, and a first bonding layer 15 formed over the top of the device layer 13. In FIGS. 1A and 3, crystal grains inside the first bonding layer 15 are indicated schematically by broken lines.

Initially, a method of forming the device layer 13 will be described. First, an n-type clad layer 31 of $(Al_zGa_{1-z})_{0.5}In_{0.5}P$ in composition and 3.0 μm thickness, a light emitting layer 32 of 0.5 μm thickness, and a p-type clad layer 33 of $(Al_zGa_{1-z})_{0.5}In_{0.5}P$ in composition and 1.0 μm thickness are sequentially epitaxial-grown by the MOCVD method one over another on, e.g., a (100) plane of an n-type GaAs (gallium arsenide) growth substrate 11 of in off angle, 350 μm thickness, and 4 inches diameter to form a semiconductor layer. Note that the light emitting layer may be a multiple quantum well (MQW) layer, a single quantum well (SQW) layer, or a single layer (so-called bulk layer). In this case, the n-clad layer 31, the light emitting layer 32, and the p-clad layer 33 match the GaAs substrate in lattice.

The multiple quantum well structure is composed of 15 pairs of a well layer and a barrier layer, for example, the well layer being an $(Al_zGa_{1-z})_{0.5}In_{0.5}P$ layer (z=0.10, 20 nm thickness), the barrier layer being an $(Al_zGa_{1-z})_{0.5}In_{0.5}P$ layer (z=0.56, 10 nm thickness). Note that the Al composition z of the well layer is adjusted within the range of $0 \leq z \leq 0.4$ according to the emission wavelength and that the Al compositions z of the n-clad layer 12 and the p-clad layer 15 are adjusted within the range of $0.4 \leq z \leq 1.0$.

Then, a contact layer 34 of $Ga_{1-x}In_xP$ in composition (x=0.1) and 1.5 μm thickness is epitaxial-grown on the p-clad layer. Here, the composition x of the $Ga_{1-x}In_xP$ contact layer is determined such that this layer does not absorb light emitted from the light emitting layer.

Then, a transparent dielectric layer 35 is formed on the GaInP contact layer 34. The transparent dielectric layer 35 together with a reflective electrode layer described later forms a reflective layer for reflecting part of light emitted from the light emitting layer 32, which part is directed toward the opposite side from the light extraction side, to improve light extraction efficiency. The transparent dielectric layer 35 is formed, for example, by forming an $SiO_2$ film of 107 nm thickness by plasma CVD, thermal CVD, sputtering, or the like and making holes of a desired shape in portions where to form contact between the reflective electrode layer 36 and the contact layer 34 by photolithography and etching using buffered hydrofluoric acid (BHF). The etching may be wet etching or dry etching. The thickness of the dielectric layer is expressed by $d=\lambda_0/(4n) \times m$, where $\lambda_0$ is the emission wavelength in a vacuum, n is the refractive index of $SiO_2$, and m is an integer. For this embodiment, assuming that $\lambda_0=625$ nm, n=1.45, and m=1.0, then d=107 nm.

Subsequently, the reflective electrode layer 36 is formed. The reflective electrode layer 36 is formed by forming an AuZn film of 300 nm thickness on the $SiO_2$ layer 35 by, e.g., sputtering, the AuZn being a metal that can form ohmic contact with the contact layer. Instead of the sputtering, resistance heating evaporation, EB vapor deposition, or the like can be used. The reflective electrode forms ohmic contact with the contact layer 34 through the openings in the $SiO_2$ layer 35 by an alloying process described later so as to work as an ohmic electrode. Note that the dielectric layer 35 may be made of another transparent dielectric material such as ITO, $Si_3N_4$, ZnO, or $Al_2O_3$ and that the reflective electrode layer may be made of another highly reflective metal such as Ag.

Then, heat treatment at about 500° C. is performed in a nitrogen atmosphere. By this means, good ohmic contact is formed between the contact layer 34 and the reflective electrode layer 36 (a p-type electrode) through the openings in the $SiO_2$ layer.

The reason why the dielectric layer 35 is formed between the reflective electrode layer 36 and the contact layer 34 is that if the reflective layer is constituted by only the reflective electrode layer 36 that is a metal film, in the alloying process for obtaining ohmic contact, morphology is worsened because of alloy layer formation at the interface between the semiconductor layer and the electrode layer, or that the reflectivity is reduced because of the diffusion of electrode material.

Herein, a semiconductor structure layer consisting of the p-type semiconductor layer, the n-type semiconductor layer, the light emitting layer, and the like, and/or the semiconductor structure layer having device constituents such as an electrode, an insulating layer, and a reflective layer added thereto as a whole is referred to as a device structure layer or a device layer.

The first bonding layer 15 that is the bonding layer of the semiconductor wafer 1 is formed over the device layer 13 formed in the above way. The first bonding layer 15 is made by forming a film of, e.g., Au that is a highly ductile metal over the device layer 13 by EB vapor deposition. The bonding layer 15 is formed such that the average size of the crystal grains of Au forming the layer is 100 nm to 500 nm and that the film thickness 500 nm. Note that the material for the first bonding layer 15 may be a metal other than Au as long as it is a highly ductile metal and that metal such as Ag, Cu, Pt, or Al can also be used.

The film thickness of Au constituting the first bonding layer 15 is preferably 100 nm or greater and more preferably 200 nm or greater in view of the sizes of the crystal grains of Au forming the first bonding layer 15 for the purpose of promoting the growth of crystal grains in the subsequent heating process.

The support structure 2 comprises a support substrate 17, a protrusion forming aid layer 19 formed over the support substrate 17, and a second bonding layer 21 formed over the protrusion forming aid layer 19. In FIG. 1B, crystal grains inside the bonding layer 21 are indicated schematically by broken lines.

The support substrate 17 is constituted by a conductive substrate of Si or the like and layers of ohmic metal such as Pt (not shown) formed on both sides of the conductive substrate by vapor deposition or the like. Another material such as Ge, Al, or Cu may be used for the support substrate 17 as long as it is conductive and high in thermal conductivity.

The protrusion forming aid layer 19 is made of Ti and is a layer having pyramid-shaped protrusions in a surface thereof. These pyramid-shaped protrusions are used as an aid structure for aiding the formation of a pyramid-shaped protrusion section 21A in a surface of the second bonding layer 21 formed later, and also work to aid the uniform crush of the pyramid-shaped protrusion section 21A in a pressure-applying closely-attaching process for the bonding layers described later.

The protrusion forming aid layer 19 for the second bonding layer is formed by three-dimensionally growing Ti on the ohmic metal layer of the support substrate 17. The protrusion forming aid layer 19 is formed to have a film thickness of 500 nm with average roughness Ra of its surface having pyramid-shaped protrusions being 11.2 nm, the density of protrusions being 5 to $8 \times 10^8/cm^2$, the average value of protrusion heights h1 being 50 nm, and the maximum value of protrusion heights h1 being about 100 nm. As to the surface having pyramid-shaped protrusions of the protrusion forming aid layer 19, the average roughness Ra can be adjusted within the range of 5 to 50 nm, and the maximum value of protrusion heights h1 can be within the range of 5 to 500 nm in order to form the surface of the bonding layer 21 to be in a desired shape, which layer is to be formed later.

The protrusion forming aid layer 19 having protrusion structures may be formed by processing the surface of the conductive substrate of Si or the like constituting the support substrate 17 rather than being formed separately from the support substrate 17. In this case, the surface of the conductive substrate may be, for example, etched to be rough, or may be patterned by nano-imprint or EB exposure. The arrangement of the protrusions, not being limited to a particular one, may be any of regular arrangements such as a triangular lattice arrangement and a square lattice arrangement, and random arrangements. Further, as to the protrusions, two-dimensional protrusion structures may be formed by etching or the like, not being limited to three-dimensional structures.

The second bonding layer 21 that is the bonding layer of the support structure 2 is made of Au that is the same metal as that of the first bonding layer 15, and includes, at its surface, the protrusion section 21A having protrusion structures similar to those of the protrusion forming aid layer 19. The second bonding layer 21 is formed by depositing Au on the protrusion surface of the protrusion forming aid layer 19 by, e.g., EB vapor deposition. The bonding layer 21 is formed to have a film thickness of 500 nm with the density of protrusions being 5 to $8 \times 10^8/cm^2$, the average value of protrusion heights h2 being 50 nm, and the maximum value of protrusion heights h2 being about 100 nm.

FIG. 2 shows a SEM image of the surface of the second bonding layer 21 having pyramid-shaped protrusions formed. This image was obtained by taking a picture of a 10 µm×10 µm size area of the surface of the protrusion section 21A. In the image, the darker color represents smaller height from the substrate while the lighter color represents greater height as shown in a longitudinal bar on the right of the figure, and the height of portions of the lightest color is about 100 nm (102.47 nm). The graph on the right of the longitudinal bar shows the distribution of heights of the surface of the second bonding layer 21 within the image. It can be confirmed from the image of FIG. 2 that multiple pyramid-shaped protrusions are formed in the protrusion section 21A at the surface of the second bonding layer 21.

Preferably, the average roughness Ra of the surface of the protrusion section 21A is 5 to 50 nm and the maximum value of protrusion heights h2 is 10 to 500 nm, and further preferably, the average roughness Ra is 10 to 25 nm and the maximum value of protrusion heights h2 is 100 to 300 nm. If the average roughness or the maximum height is too large, then necessary temperature and pressure in the subsequent compression bonding increase, and in addition a large number of voids occur at the junction interface between the bonding layers, so that the possibility of a junction failure occurring is increased. The second bonding layer 21 is formed such that the sizes of the crystal grains thereof are 100 to 500 nm. The thickness of the bonding layer 21 is preferably 100 nm or greater and more preferably 200 nm or greater in view of the sizes of the crystal grains of Au forming the second bonding layer for the purpose of promoting the growth of crystal grains in the subsequent heating process. Further, the vertex angle of the pyramid-shaped protrusion is 40° or less so that the surface area of the protrusion section 21A is 1.5 times or more greater than that in the case where no pyramid-shaped protrusions are formed, and preferably 30° or less so that the surface area is 2.0 times or more greater.

The average size of crystal grains inside the first bonding layer 15 and the second bonding layer 21 should be 300 nm or less. With smaller crystal grain sizes (the total surface area of crystal grains being larger), crystal grain growth progresses at lower temperature, thus enabling the bonding at lower temperature, and also the growth of crystal grains can decrease voids at the junction interface.

Pyramid-shaped protrusions in the surface of the second bonding layer 21 are to be formed in the same shape as pyramid-shaped protrusions formed in the protrusion forming aid layer 19, and hence for the pyramid-shaped protrusions formed in the protrusion forming aid layer 19, as for pyramid-shaped protrusions to be formed in the bonding layer 21, preferably, the average roughness Ra is 5 to 50 nm and the maximum value of protrusion heights h1 is 10 to 500 nm, and further preferably, the average roughness Pa is 10 to 25 nm and the maximum value of protrusion heights h1 is 100 to 300 nm. Further, the vertex angle of the pyramid-shaped protrusion of the protrusion forming aid layer 19 is 40° or less so that the surface area of the protrusion section is 1.5 times or more greater than that in the case where no pyramid-shaped protrusions are formed, and preferably 30° or less so that the surface area is 2.0 times or more greater.

The semiconductor wafer 1 and the support structure 2 formed in the above way are bonded together via the bonding layers 15 and 21, and the growth substrate 11 is removed, thereby producing a semiconductor light emitting element 3 shown in FIG. 3. Because no eutectic material is used in the bonding of the semiconductor light emitting element 3, the diffusion of Sn, In, or the like does not occur, and thus a barrier metal layer does not need to be formed.

The method of bonding the semiconductor wafer 1 and the support structure 2 together to produce the light emitting element 3 will be described below using FIGS. 4A to 4D. FIGS. 4A to 4D are cross-sectional views showing the steps of a manufacturing method of the light emitting element according to Embodiment 1 of the present invention. In FIGS. 4A to 4D, crystal grains inside the first and second bonding layers 15, 21 are indicated schematically by broken lines. Note that the layer structure inside the device layer 13 is omitted.

Figure 4A:
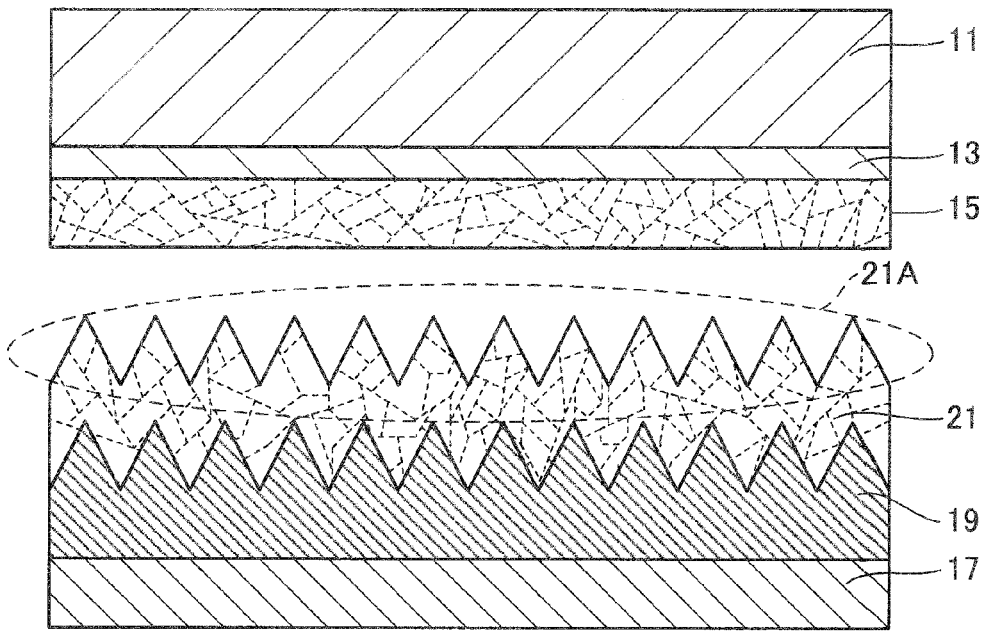
FIG. 4A is a cross-sectional view showing one step of the manufacturing method according to Embodiment 1 of the present invention.
Figure 4B:
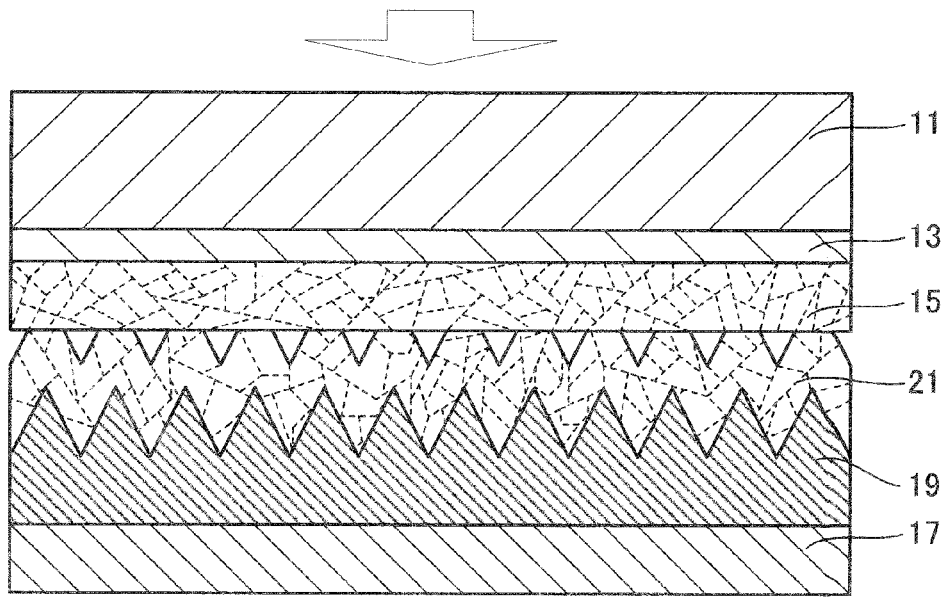
FIG. 4B is a cross-sectional view showing one step of the manufacturing method according to Embodiment 1 of the present invention.

First, as shown in FIG. 4A, the semiconductor wafer 1 and the support structure 2 are placed such that their bonding layers 15 and 21 are opposite to each other. Then, as shown in FIG. 4B, the surface of the first bonding layer 15 and the protrusion section 21A of the second bonding layer 21 are put in contact with each other, and a pressure of 1.5 MPa is applied in opposite directions (indicated by arrows) to crush the top of the protrusion section 21A so as to make the surface of the first bonding layer 15 and the second bonding layer 21 closely attached. The pressure applied in this pressure application is preferably 0.5 MPa or greater in order to crush the top of the protrusion section 21A so as to make the surface of the first bonding layer 15 and the surface of the second bonding layer 21 closely attached, and 5.0 MPa or less so as not to damage the device layer 13 of the semiconductor wafer 1. Further, preferably pressure application is performed with even pressure over the junction surface so that the surface of the first bonding layer 15 and the surface of the second bonding layer 21 are closely attached uniformly over the junction surface.

In this pressure-applying closely-attaching process, the protrusion section 21A in contact with the junction surface is crushed, so that the surface of the first bonding layer 15 and the surface of the second bonding layer 21 are closely attached, and thus a large number of small crystal grains with multiple crystal grain boundaries exist adjacent to the junction surface. The diffusion coefficient D of metal is generally given by $D=D_0 \exp(-Q/RT)$. Here, $D_0$ is a frequency term (entropy term), Q is activation energy, and T is an absolute temperature. The present invention controls the grain boundaries and surface areas of the bonding layers, thereby enabling the bonding at low temperature. At grain boundaries, the diffusion coefficient is greater by 10 to 20 digits than in the bulk because Q is $\frac{1}{2}$ to $\frac{1}{3}$ of that in the bulk. Hence, by making multiple crystal grain boundaries exist adjacent to the junction surface, the diffusion coefficient can be made greater even if the absolute temperature is low in the subsequent heating process, and thus crystal grains are more likely to grow in the area adjacent to the junction surface.

Figure 4C:
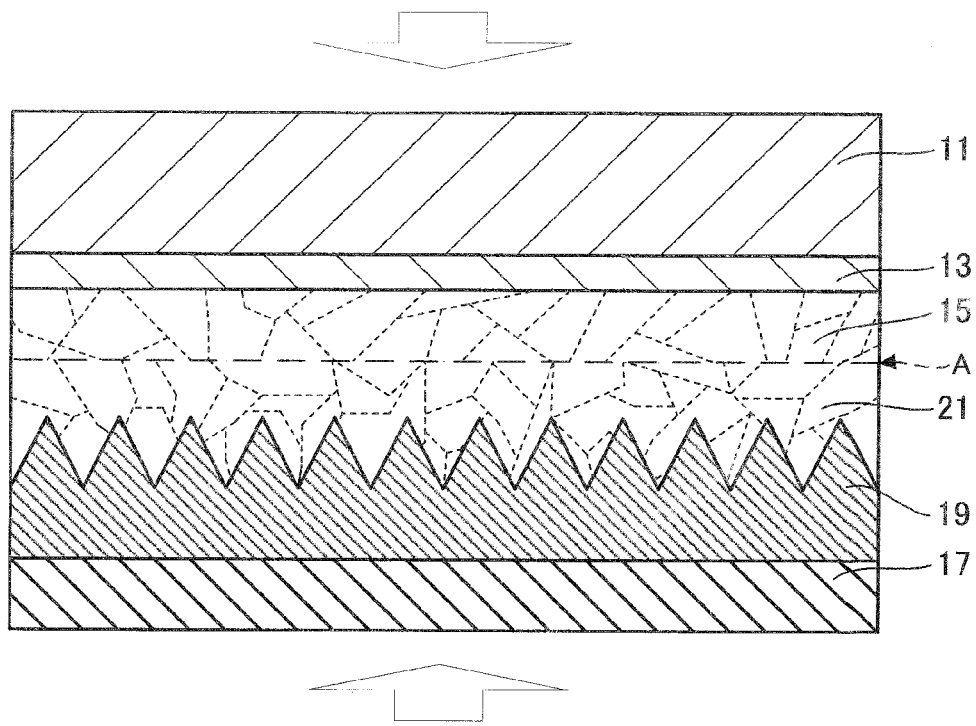
FIG. 4C is a cross-sectional view showing one step of the manufacturing method according to Embodiment 1 of the present invention.

Then, as shown in FIG. 4C, with the above pressure application being continued, a first heating process is performed in which the semiconductor wafer 1 and the support structure 2 are held closely attached under an applied pressure of 1.5 MPa at 200° C. for 30 minutes. By this heating, the first bonding layer 15 and the second bonding layer 21 are bonded together to be put in a first bonded state. Note that the temperature of the first heating process is the measured temperature of the stage on which the light emitting element 3 is mounted and that because material having a large heat capacity is used for the stage, that temperature can be regarded as the temperature of the sample (light emitting element 3).

The first heating process is preferably performed at temperature equal to or higher than about 100° C. that is half of the maximum Tr (=about 200° C.) of the standard recrystallizing temperature at which the growth of crystal grains of Au forming the first and second bonding layers 15, 21 progresses. Note that the first heating process is preferably performed at a temperature of about 250° C. or lower such that the semiconductor wafer 1 does not warp to break. By the first heating process, the growth of crystal grains progresses at the junction interface between the first and second bonding layers 15 and 21, and thus the first bonding layer 15 and the second bonding layer 21 are stuck together to get into a first bonded state.

Figure 5A:
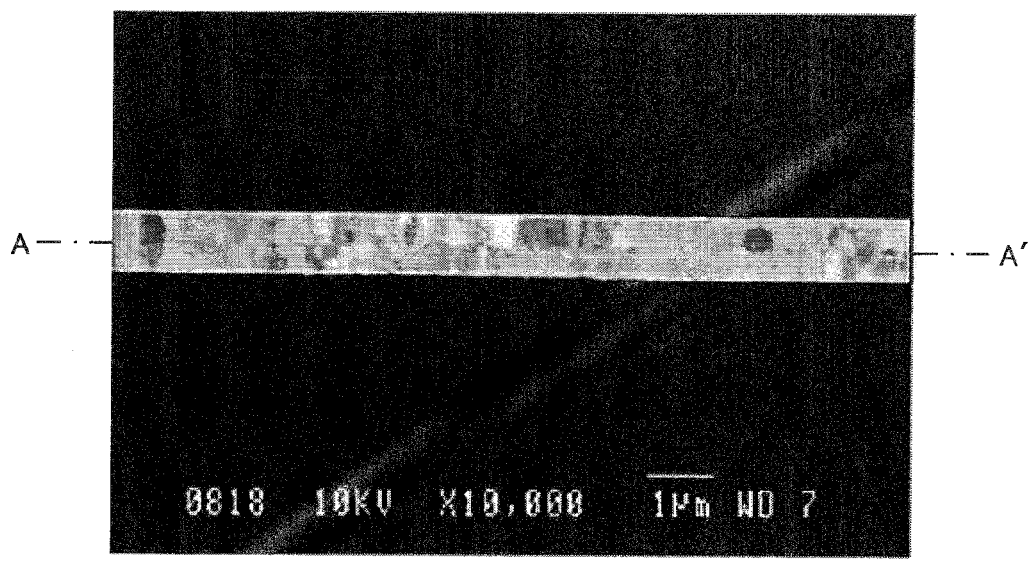
FIG. 5A is a cross-sectional SEM image of the bonding layers after the first heating process of the manufacturing method according to Embodiment 1 of the present invention.

FIG. 5A shows a cross-sectional SEM image (×10,000) of the bonding layers in the first bonded state after the first heating process. Although the first bonding layer 15 and the second bonding layer 21 are bonded together after the first heating process, multiple voids exist in the bonding layers, and as shown in FIGS. 4C and 5A, a junction interface (indicated by an arrow A in FIG. 4C and line A-A' in FIG. 5A), where crystal grain boundaries relatively low in strength exist in a line, is formed in the junction portion between the first and second bonding layers 15 and 21, resulting in the bonding being not strong. The warp of the semiconductor wafer 1 after the first heating process is 100 μm or less to be so suppressed that the wafer does not suffer damage due to stress.

Figure 4D:
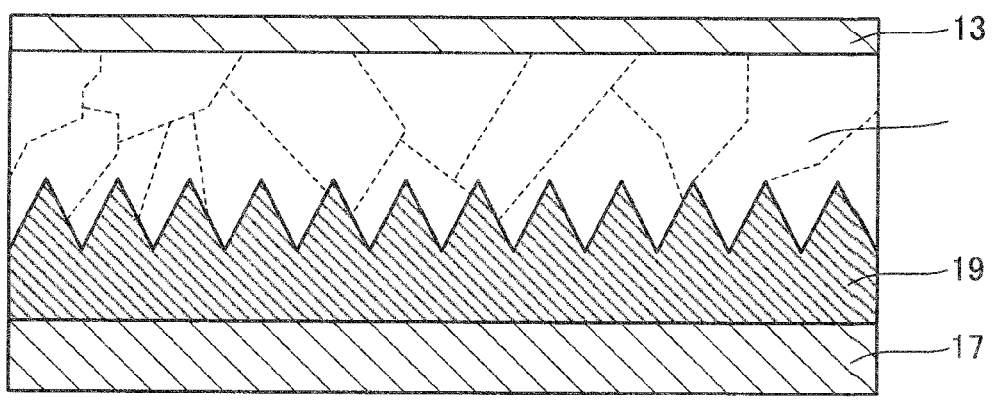
FIG. 4D is a cross-sectional view showing one step of the manufacturing method according to Embodiment 1 of the present invention.

Next, as shown in FIG. 4D, the semiconductor wafer 1 and the support structure 2 are cooled to room temperature, and the pressure externally applied in the first heating process is removed, and the growth substrate 11 is removed from the semiconductor wafer 1, thereby making internal stress accumulate in the first and second bonding layers 15 and 21. The removal of the growth substrate 11 in this stress accumulating process is performed by wet etching using, e.g., an ammonia hydrogen peroxide mixture etchant. The removal of the growth substrate 11 may be performed by dry etching, mechanical polishing, chemical mechanical polishing (CMP), or a combination of at least one of these methods, not being limited to wet etching. By the removal of the growth substrate 11, the device layer 13 is exposed.

After this stress accumulating process, internal stress is accumulated inside the first bonding layer 15 and the second bonding layer 21 because of cooling from heating temperature, release from applied pressure, and the removal of the substrate. The recrystallization of metal and the growth of crystal grains progress so as to lessen the internal stress and hence are promoted in an internal-stress accumulated state. Thus, a second heating process described below progresses under the condition that recrystallization and crystal grain growth are promoted.

Subsequently, under this condition that recrystallization and crystal grain growth are promoted, the second heating process is performed which heats the semiconductor wafer 1 and the support structure 2 at 100° C., which is half of the maximum Tr of the standard recrystallizing temperature of Au, without applied pressure for 30 minutes. By this heating, recrystallization and thus crystal grain growth occur inside the first bonding layer 15 and the second bonding layer 21, especially, in the area adjacent to the junction surface, where multiple crystal grain boundaries and small crystal grains exist. By this recrystallization and crystal grain growth in the area adjacent to the junction surface, voids at the junction surface disappear (the cross-section area ratio becomes 20% or less), crystal grain boundaries relatively low in strength in the junction portion disappear, and thus very strong bonding of the semiconductor wafer 1 and the support structure 2 is achieved.

Figure 5B:
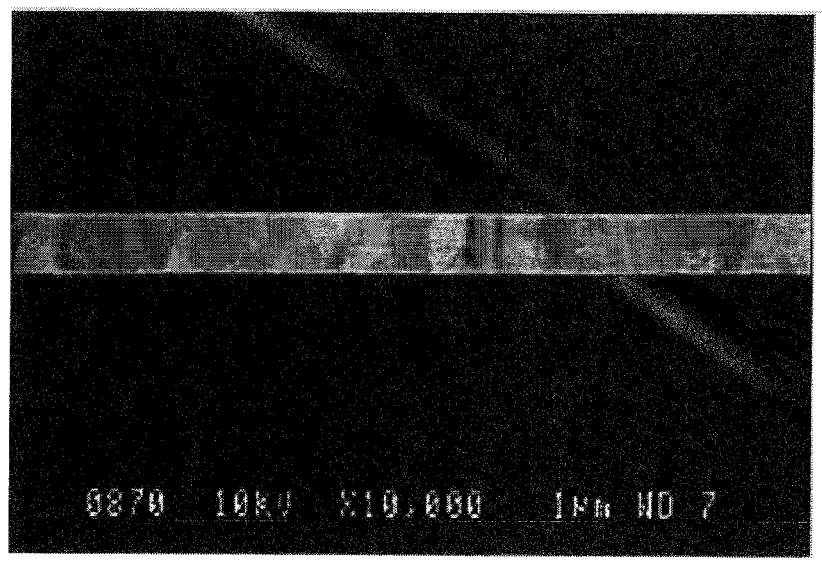
FIG. 5B is a cross-sectional SEM image of the bonding layers after the second heating process of the manufacturing method according to Embodiment 1 of the present invention.

FIG. 5B shows a cross-sectional SEM image (×10,000) of the first bonding layer 15 and the second bonding layer 21 after the second heating process. As shown in FIGS. 4D and 5B, the junction interface including crystal grain boundaries in a line that existed in the junction portion after the first heating process disappears after the second heating process.

The second heating process can be finished for shorter time with a higher heating temperature and is performed at least at a temperature equal to or higher than half (100° C. for Au) of the maximum Tr of the recrystallizing temperature, preferably for strong bonding, at a temperature equal to or higher than Tr (200° C. for Au). In the case where the second heating process is performed at a temperature that is about half of Tr as above, the heating process is performed at least for five minutes, preferably for 30 minutes or longer.

The heating time need not be continuous, but the heating may be performed several times intermittently. Further, in the case where treatment at a high temperature equal to or higher than the recrystallizing temperature is necessary in the treatment process after the removal of the growth substrate 11, the second heating process may be replaced with that treatment. For example, photolithography or heat treatment such as alloy treatment can be replaced with the second heating process.

In the light emitting element manufacturing process of this embodiment, heating at about 400° C. is performed in alloy treatment for forming an electrode on the n-type clad layer after the removal of the growth substrate, and hence the second heating process can be replaced with that alloy treatment.

After the above process finishes, an ohmic electrode (not shown) on the light extraction surface side is formed on the n-type clad layer at the surface of the device layer 13 exposed by the removal of the growth substrate to form ohmic contact with the n-type clad layer. AuGeNi, AuGe, AuSn, AuSnNi, and the like can be used as material that can form ohmic contact with an n-type semiconductor. Then, a bonding pad (not shown) for electrically connect the ohmic electrode to the outside is formed by forming a layer of 50 to 300 nm thickness that comprises Ta, Ti, W, WSi, Pt, Cu, or an alloy containing any of them and a nitride film, and forming a film of Au of 1.5 µm thickness on the layer so as to form a Schottky electrode (including the bonding pad) (not shown).

The ohmic electrode and the Schottky electrode may be formed by, e.g., a lift-off method with using resistance heating evaporation, EB vapor deposition, sputtering, or the like as a vapor deposition method. Further, in order to form good ohmic contact between the n-type clad layer and the ohmic electrode on the light extraction surface side, alloying is performed by heat treatment at about 400° C. in a nitrogen atmosphere. Having undergone the above processes, the light emitting element 3 is finished.

Figure 6A:
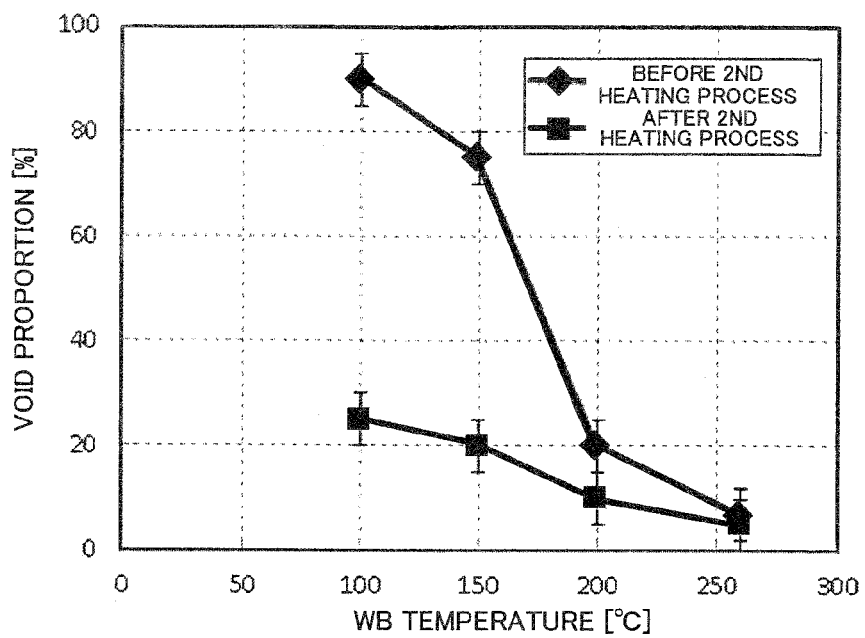
FIG. 6A shows the proportion of voids of the junction formed by the manufacturing method according to Embodiment 1 of the present invention.
Figure 6B:
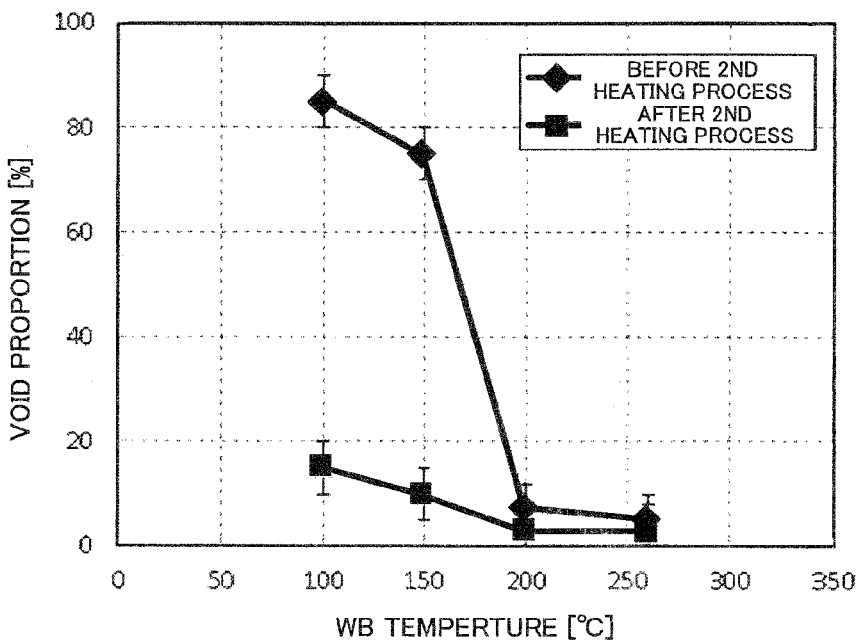
FIG. 6B shows the proportion of voids of the junction formed by the manufacturing method according to Embodiment 1 of the present invention.

FIGS. 6A and 6B show bonding results when the bonding was performed using Embodiment 1. FIGS. 6A and 6B show relations between the thicknesses of the first bonding layer and the second bonding layer, the heat treatment temperature (WB temperature in the figure) in the first heating process, and voids at the junction interface before and after the second heating process, when heated at 100° C. for 30 minutes in the second heating process.

As shown in FIG. 6A, it is seen that where the thickness of each bonding layer is 200 nm, when heated at 150° C. or higher in the first heating process, strong bonding having a void proportion of 20% or less is possible with the second heating process. Further, as shown in FIG. 6B, it is seen that where the thickness of each bonding layer is 400 nm, when heated at 100° C. or higher in the first heating process, strong bonding having a void proportion of 15% or less is possible with the second heating process. In particular, if the heating temperature in the second heating process is 200° C. or higher, bonding with almost no voids is possible.

With the manufacturing method of the LED element according to Embodiment 1, barrier metal is not needed in the bonding of the semiconductor wafer 1 and the support structure 2, and without treatment at high temperature that will cause such a warp as to damage the device layer 13, strong bonding with fewer voids at the junction surface and without crystal grain boundaries in the junction surface can be performed. Further, even if material not resistant to high heat is used, strong bonding can be performed without degrading the material. Thus, the yield and quality of the LED element can be improved.

Embodiment 2

Figure 7:
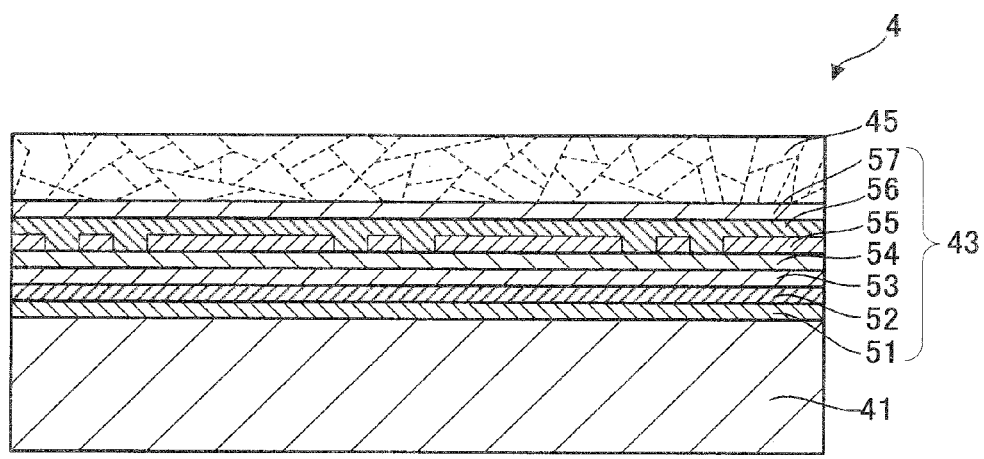
FIG. 7 is a cross-sectional view of a semiconductor wafer to be bonded by the manufacturing method according to Embodiment 2 of the present invention.

A manufacturing method of a light emitting element according to Embodiment 2 of the present invention will be described below with reference to FIG. 7. FIG. 7 is a cross-sectional view of a semiconductor wafer 4 to be bonded by the manufacturing method of the light emitting element according to Embodiment 2.

For Embodiment 2, description will be made taking GaIl-based LED as an example.

The semiconductor wafer 4 comprises a growth substrate 41, a device layer 43 grown over the growth substrate 41, and a first bonding layer 45 formed over the top of the device layer 43. In FIG. 7, crystal grains inside the first bonding layer 45 are indicated schematically by broken lines.

Firstly, a method of forming the device layer 43 will be described. First, an n-type clad layer 51 of GaN of 5.0 µm thickness, a light emitting layer 52 of 75 nm thickness, a p-type barrier layer 53 of $Al_{0.2}Ga_{0.8}N$ in composition and 40 nm thickness, and a p-type clad layer 54 of GaN of 100 nm thickness are sequentially epitaxial-grown by the MOCVD method one over another on, e.g., a (001) plane of a sapphire substrate 41 of 600 µm thickness and 4 inches diameter to form a semiconductor layer. Note that the light emitting layer may be a multiple quantum well (MQW) layer, a single quantum well (SQW) layer, or a single layer (so-called bulk layer). In this case, the n-clad layer 51, the light emitting layer 52, the p-type barrier layer 53, and the p-clad layer 54 match the sapphire growth substrate 41 in lattice.

The multiple quantum well structure is composed of 5 pairs of a well layer and a barrier layer, for example, the well layer being an $In_xGa_{1-x}N$ layer (x=0.35, 2 nm thickness), the barrier layer being a GaN layer (14 nm thickness). Note that the In composition x of the well layer is adjusted within the range of $0 \leq x \leq 1.0$ according to the emission wavelength.

Then, a transparent dielectric layer 55 is formed on the p-clad layer 54. The transparent dielectric layer 55 together with a reflective electrode layer 56 described later forms a reflective layer for reflecting part of light emitted from the light emitting layer 52, which part is directed toward the opposite side from the light extraction side, to improve light extraction efficiency. The transparent dielectric layer 55 is formed, for example, by forming an ITO film of 10 nm thickness by sputtering or the like and making holes of a desired shape by photolithography and so on. In Embodiment 2, the thickness of the transparent dielectric layer 55 is set at 10 nm.

Subsequently, the reflective electrode layer 56 made of Ag is formed. The reflective electrode layer 56 is formed by forming an Ag film of 300 nm thickness on the transparent dielectric layer 55 by, e.g., sputtering. Instead of the sputtering, resistance heating evaporation, EB vapor deposition, or the like can be used.

Finally, in order to prevent Ag constituting the reflective electrode layer 56 from diffusing, a Ti layer (200 nm) plus a Pt layer (100 nm), as a diffusion preventing barrier layer 57, is formed over the reflective electrode layer 56.

The first bonding layer 45 that is the bonding layer of the semiconductor wafer 4 is formed over the device layer 43 formed in the above way. The first bonding layer 45 is formed by forming a film of, e.g., Au that is a highly ductile metal over the device layer 43 by SB vapor deposition. The bonding layer 45 is formed such that the average size of the crystal grains of Au forming the layer is 100 nm to 500 nm and that the film thickness is 500 nm. Note that the material for the first bonding layer 45 may be a metal other than Au as long as it is a highly ductile metal and that metal such as Ag, Cu, Pt, or Al can also be used.

The film thickness of Au constituting the first bonding layer 45 is preferably greater than the sizes of the crystal grains of Au forming the first bonding layer 45, i.e., 100 nm or greater, and more preferably 250 nm or greater for the purpose of promoting the growth of crystal grains in the subsequent heating process.

In Embodiment 2, the support structure takes on exactly the same structure as the support structure 2 of Embodiment 1.

Further, in Embodiment 2, the method of bonding the semiconductor wafer 4 and the support structure is almost the same as the bonding method in Embodiment 1. In Embodiment 2, because heat of 200° C. or higher would cause an increase in the contact resistance between the ITO used for the transparent dielectric layer 55 and the device layer and a reduction in the light transmittance of the ITO, the heating temperature 150° C. in the first heating process and the second heating process, in which point Embodiment 2 differs.

With the manufacturing method of the LED element according to Embodiment 2, in the bonding of the semiconductor wafer 4 and the support structure, without treatment at high temperature that will cause such a warp as to damage the device layer 43, strong bonding with fewer voids at the junction surface and without crystal grain boundaries in the junction surface can be performed as in Embodiment 1. Further, in Embodiment 2, because ITO that becomes deformed at a relatively low temperature of 200° C. is used, the usefulness of the feature of the manufacturing method of the present invention having the bonding process which does not need high-temperature treatment, works very greatly.

Although in the above embodiments the protrusion forming aid layer and the bonding layer having the protrusion section are formed at the bonding surface of the support structure, the protrusion forming aid layer and the bonding layer having the protrusion section may be formed at the bonding surface of the semiconductor wafer.

In the above embodiments, in the stress accumulating process, the semiconductor wafer and the support structure are cooled; the growth substrate is removed; and the pressure applied in the first heating process is removed, thereby making internal stress accumulate in the bonding layers, but at least one of the cooling, the removal of the growth substrate, and the removal of pressure may be performed, thereby making internal stress accumulate.

Although in the above embodiments the semiconductor wafer and the support structure are cooled to room temperature, they do not need to be cooled to room temperature as long as internal stress can be made to accumulate such that recrystallization and crystal grain growth in the bonding layers are promoted to such a degree that crystal grain boundaries existing in the junction interface disappear in the second heating process. Further, instead of being completely removed, pressure applied in the first heating process may be increased or decreased, or mechanical stress may be applied externally.

Although in the above embodiments description has been made taking a light emitting element as an example, the manufacturing method of the present invention can be applied to the manufacture of other electronic devices.

Various numerical values, sizes, materials, and so on in the above embodiments are only illustrative, and appropriate ones can be selected according to application, the light emitting element manufactured, or the like.

This application is based on Japanese Patent Application No. 2012-034900 which is herein incorporated by reference.

What is claimed is:

1. A manufacturing method of a semiconductor light emitting element, the method comprising:
    a step of forming a device structure layer including a semiconductor layer on a first substrate;
    a step of forming a first metal layer on said device structure layer;
    a step of forming a second metal layer made of the same material as said first metal layer on a second substrate;
    a first treatment step of heating and compressing together said first metal layer and said second metal layer placed so as to oppose each other, thereby bonding said first metal layer and said second metal layer while maintaining a junction interface between said first metal layer and said second metal layer;
    wherein one of said first metal layer and said second metal layer has a coarse surface which faces said junction interface and has multiple pyramid-shaped protrusions, and
    wherein said first treatment step comprises a step of crushing said pyramid-shaped protrusions; and a second treatment step of heating said first metal layer and said second metal layer to make said junction interface disappear.

2. The manufacturing method according to claim 1, wherein said second treatment step comprises a step of increasing internal stress inside said first metal layer and said second metal layer, and a step of subsequent heating.

3. The manufacturing method according to claim 2, wherein said step of increasing internal stress comprises a step of cooling said first metal layer and said second metal layer to a temperature lower than a heating temperature in said first treatment step.

4. The manufacturing method according to claim 2, wherein said step of increasing internal stress comprises a step of decreasing applied pressure in said first treatment step.

5. The manufacturing method according to claim 2, wherein said step of increasing internal stress comprises a step of removing said first substrate.

6. The manufacturing method according to claim 1, wherein said metal layer having said pyramid-shaped protrusions is formed by forming a protrusion forming aid layer having pyramid-shaped protrusions on one of said device structure layer and said second substrate and forming said metal layer on said protrusion forming aid layer.

7. The manufacturing method according to claim 1, wherein said first and second metal layers are made of one of Au, Ag, Al, Cu, and Pt.

\* \* \* \* \*